United States Patent
Yachareni et al.

(10) Patent No.: US 6,532,175 B1
(45) Date of Patent: Mar. 11, 2003

(54) METHOD AND APPARATUS FOR SOFT PROGRAM VERIFICATION IN A MEMORY DEVICE

(75) Inventors: Santosh K. Yachareni, Santa Clara, CA (US); Edward V. Bautista, Jr., Santa Clara, CA (US); Weng Fook Lee, Penang (MY)

(73) Assignee: Advanced Micro Devices, In., Sunnyvale, CA (US)

( * ) Notice: Subject to any disclaimer, the term of this patent is extended or adjusted under 35 U.S.C. 154(b) by 0 days.

(21) Appl. No.: 10/050,650

(22) Filed: Jan. 16, 2002

(51) Int. Cl.[7] .......................... G11C 16/04; G11C 16/06
(52) U.S. Cl. .................. 365/185.22; 365/185.28; 365/185.3
(58) Field of Search .................. 365/185.18, 185.22, 365/185.28, 185.3, 185.33

(56) References Cited

U.S. PATENT DOCUMENTS

| | | | |
|---|---|---|---|
| 5,812,461 A | 9/1998 | Komarek et al. | |
| 5,822,247 A | * 10/1998 | Tassan Caser et al. | . 365/185.18 |
| 5,841,700 A | 11/1998 | Chang | |
| 5,896,314 A | 4/1999 | Chen | |
| 5,917,743 A | 6/1999 | Roy | |
| 6,091,642 A | * 7/2000 | Pasotti et al. | .......... 365/185.29 |
| 6,331,951 B1 | * 12/2001 | Bautista et al. | ........ 365/185.22 |

* cited by examiner

Primary Examiner—Son Mai
(74) Attorney, Agent, or Firm—Eschweiler & Associates, LLC

(57) ABSTRACT

Methods and apparatus are disclosed for verifying soft programming of one or more memory cells in a memory device. The methods comprise providing a voltage source to the core cell gate, and verifying soft programming of the cell after overshoot in the regulated voltage source has settled. Also disclosed are memory devices having a logic circuit providing a regulated voltage source to the cell gate during a soft program verify operation, and a sensor to verify soft programming of the cell when a first voltage is applied to the gate from the regulated voltage source. The logic circuit provides a soft program verify signal to the sensor to verify soft programming after overshoot in the voltage source has settled.

25 Claims, 7 Drawing Sheets

METHOD AND APPARATUS FOR SOFT PROGRAM VERIFICATION IN A MEMORY DEVICE

FIELD OF INVENTION

The present invention relates generally to memory systems and more particularly to apparatus and methodologies for verifying soft programming in semiconductor memory devices.

BACKGROUND OF THE INVENTION

Flash and other types of electronic memory devices are constructed of thousands or millions of memory cells, adapted to individually store and provide access to data. A typical memory cell stores a single binary piece of information referred to as a bit, which has one of two possible states. More recently, dual bit memory cell architectures have been introduced, wherein each cell can store two bits of data. The cells are commonly organized into multiple cell units such as bytes which comprise eight cells, and words which may include sixteen or more such cells, usually configured in multiples of eight. Storage of data in such memory device architectures is performed by writing to a particular set of memory cells, sometimes referred to as programming the cells. Retrieval of data from the cells is accomplished in a read operation. In addition to programming and read operations, groups of cells in a memory device may be erased, wherein each cell in the group is programmed to a known state.

The individual cells are organized into individually addressable units or groups such as bytes or words, which are accessed for read, program, or erase operations through address decoding circuitry, whereby such operations may be performed on the cells within a specific byte or word. The individual memory cells typically include a semiconductor structure adapted for storing a bit of data. For instance, many conventional memory cells include a metal oxide semiconductor (MOS) device, such as a transistor in which a binary piece of information may be retained in the form of electrical charge. The memory device includes appropriate decoding and group selection circuitry to address such bytes or words, as well as circuitry to provide voltages to the cells being operated on in order to achieve the desired operation.

The erase, program, and read operations are commonly performed by application of appropriate voltages to certain terminals of the cell. In an erase or program operation the voltages are applied so as to cause a change in charge to be stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access to other devices in a system in which the memory device is employed.

Flash memory is a type of electronic memory media which can be rewritten and hold its content without power. Flash memory devices generally have life spans from 100K to 10MEG write cycles. Unlike dynamic random access memory (DRAM) and static random access memory (SRAM) memory chips, in which a single byte can be erased, flash memory is typically erased and written in fixed multi-bit blocks or sectors. Conventional flash memories are constructed in a cell structure wherein a single bit of information is stored in each flash memory cell. In such single bit memory architectures, each cell typically includes a MOS transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

The control gate is connected to a wordline associated with a row of such cells to form sectors of such cells in a typical NOR configuration. In addition, the drain regions of the cells are connected together by a conductive bitline. The channel of the cell conducts current between the source and the drain in accordance with an electric field developed in the channel by the stacked gate structure. In the NOR configuration, each drain terminal of the transistors within a single column is connected to the same bitline. In addition, each flash cell associated with a given bit line has its stacked gate terminal coupled to a different wordline, while all the flash cells in the array have their source terminals coupled to a common source terminal. In operation, individual flash cells are addressed via the respective bitline and wordline using peripheral decoder and control circuitry for programming (writing), reading or erasing functions.

Programming a flash memory cell is typically done by channel hot electron (CHE) by grounding the source region, applying a relatively high positive voltage to the control gate and applying a moderate voltage to the drain to generate high energy or hot electrons, which accumulate in the floating gate until the effective threshold voltage of the cell rises to a programmed threshold voltage, which is sufficient to inhibit current flow through the channel region during any subsequent read mode operation. Typically, in the read mode, a relatively low positive voltage is applied to the drain, a moderate voltage is applied to the control gate and the source is grounded. The magnitude of the resulting current can be sensed in order to ascertain whether the cell is programmed or erased.

Erasing flash cells is done using Fowler-Nordheim tunneling between the floating gate and the source (e.g., source erase or negative gate erase) or between the floating gate and the substrate (e.g., channel erase). In a source erase operation, a high positive voltage (e.g., approximately 12V) is provided to the source, the gate and the substrate are grounded, and the drain is floated. Negative gate erase operation involves providing a moderate positive voltage (e.g., 5V or VCC) to the source, floating the drain, grounding the substrate, and applying a negative voltage (e.g., −10V) to the gate. Channel erase operation involves applying a high positive voltage to the substrate and grounding the gate, while the source and drain are floated.

When a sector of memory cells is erased, an erase verify operation is subsequently performed to ensure proper erasure of each of the cells in the sector. Thereafter, soft programming is employed, wherein a small amount of charge is injected into the cell to rectify or mitigate over-erased conditions resulting from repeated erasure of the cell. The amount of charge injected during the soft programming is controlled so as not to overprogram the cell, so that it passes erase verify even after a soft program verify operation, which is performed right after the soft programming operation.

During soft program verify operations, a positive voltage is provided to the gate terminal of the cell by an internally generated voltage source in the memory device. However, if such a voltage source provides an unstable gate voltage, or where the voltage level is too high (e.g., due to overshoot), anomalous soft program verify results may be obtained. For example, improperly erased or over-erased cells may be identified as good, and/or properly erased cells may be identified as bad. As memory device densities continue to increase, providing dedicated voltage sources for the various cell terminals (e.g., gate, drain, source, etc.) for each operation (e.g., read, write, erase, soft program verification, etc.) is difficult and may not be cost effective. However, the impedance characteristics of the various terminals during such operations makes it difficult to apply a single voltage source to such varied tasks. Thus, there is a need for methodologies and apparatus by which voltage sources may be employed for different cell terminals during different operations, while mitigating or avoiding anomalous results associated with high or unstable soft program verify gate voltage levels.

SUMMARY OF THE INVENTION

The following presents a simplified summary in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later.

The invention relates to methods and apparatus for verifying soft programming of one or more cells in a memory device, which allow the use of a drain pump or other voltage source in applying a gate voltage during soft program verification. The invention finds application in association with single-bit (e.g., stacked gate) as well as dual bit memory cell architectures. In one aspect of the invention, methods comprise providing a voltage source to a core cell gate, and verifying soft programming after an overshoot in the regulated voltage source has settled, whereby adverse effects associated with a high or unstable gate voltage can be mitigated or avoided. This technique can be employed to allow use of many different voltage source types found in flash and other memory devices (e.g., single stage pump circuits, multi-stage pumps, etc.) to provide voltage to a cell gate during a soft program verification or other operations, even where such voltage sources suffer from initial overshoot or instability.

Another aspect of the invention provides memory devices having a logic circuit providing a regulated voltage source to the core cell gate during a soft program verify operation, and a sensor to verify soft programming of the cell when a first voltage (e.g., about 2.7 volts) is applied to the gate from the regulated voltage source. In order to ensure proper verification of the soft programming, the logic circuit provides a soft program verify signal to the sensor to verify soft programming after an overshoot in the voltage source has settled, such as by waiting a fixed time period after the voltage source initially rises to a regulation value (e.g., about 4 volts in one implementation). For example, a delay or wait time may be established by the logic circuit after the voltage source's initial rise to a regulation level, to allow the regulation to reduce (e.g., settle) any intervening overshoot, by which a stable gate voltage of proper level is applied at the time when the verify is performed.

The invention thus allows use of a variety of voltage sources, such as a drain pump, in providing the gate voltage during soft program verify operations. For example, where the drain pump is alternatively used for connection to the drain during programming, such pump may be capable of supplying a relatively large amount of current (e.g., 2 mA). Although the soft program verify operation uses the resistor divided voltages from the drain pump to the gate of the core cell and the gate of the reference cell, which might result in gate voltage overshoot, the invention advantageously waits to perform the soft program verify until such overshoot has subsided. This may be accomplished using a logic circuit or system verifying that the cell is currently in a soft program verify mode, and that the voltage source (e.g., the drain pump) level has risen above the regulation level (e.g., about 4 volts). Thereafter, the logic circuit delays the provision of a soft program verify signal to the associated sensor, for example, by a fixed time period (e.g., about 200 ns or more and about 500 ns or less, such as about 400 ns).

This wait period can be implemented using timers, or other circuitry, whereby proper soft program verification is facilitated.

Another aspect of the invention provides methodologies for verifying soft programming in a memory device, wherein a regulated voltage source is provided to the cell gate through a voltage divider during a soft program verify operation, and soft programming of the core cell is verified using a sensor after overshoot in the regulated voltage source has settled. The verification may comprise waiting a fixed time period (e.g., about 400 ns) after the voltage source is greater than a certain voltage, such as a regulation value (e.g., about 4 volts in one implementation), and sensing a current associated with the cell after the fixed time period using a sensor.

The wait period can be implemented by creating a first signal when the regulated voltage source has a value greater than a second voltage using a first circuit, generating a first wait signal indicative of a fixed time period according to the first signal using a second circuit, providing a second wait signal a fixed time period after the first signal using a timer circuit, and providing a soft program verify signal to the sensor according to the second wait signal using a state machine. The invention thus provides flexibility in the design of memory circuits, by which voltage sources suffering from overshoot problems can successfully be employed in providing soft program verify gate voltages.

To the accomplishment of the foregoing and related ends, the following description and annexed drawings set forth in detail certain illustrative aspects and implementations of the invention. These are indicative of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
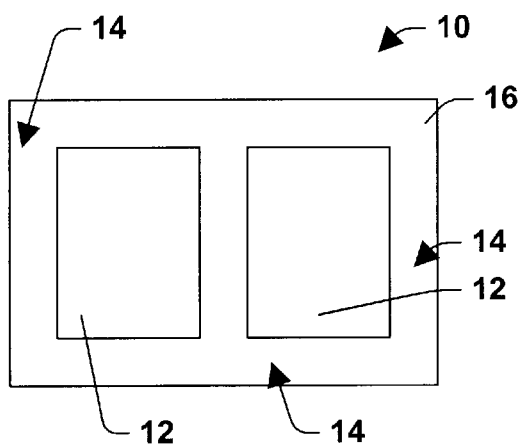
FIG. 1 is a plan view schematically illustrating an exemplary layout of a memory device.

The present invention will now be described with reference to the drawings, wherein like reference numerals are used to refer to like elements throughout. The present invention relates to methods and apparatus for verifying soft programming of memory cells in a flash memory device. The invention finds particular utility in verifying the state of memory cells following soft programming, wherein a voltage source having relatively high current capacity (e.g., such as a drain pump or other such voltage source) can be advantageously employed to provide the gate voltage for the cell, for example, wherein the drain pump is generally used to provide sufficient current during channel hot electron (CHE) programming.

Figure 2:
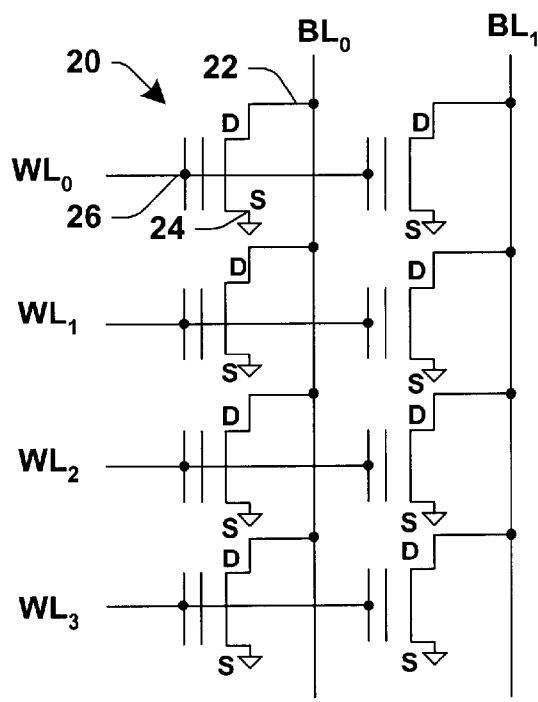
FIG. 2 is a schematic diagram illustrating an exemplary core portion of a NOR-type memory circuit.

Referring initially to FIGS. 1 and 2, semiconductor memory devices typically include multiple individual components formed on or within a substrate. Such devices often comprise a high density section and a low density section. For example, as illustrated in FIG. 1, a memory device such as a flash memory 10 comprises one or more high density core regions 12 and a low density peripheral portion 14 on a single substrate 16. The high density core regions 12 typically include at least one M×N array of individually addressable, substantially identical, memory cells and the low density peripheral portion 14 typically includes input/output (I/O) circuitry and circuitry for selectively addressing the individual cells (such as decoders for connecting the source, gate and drain of selected cells to predetermined voltages or impedances to enable designated operations of the cell such as programming, reading or erasing).

The memory cells within the core portion 12 are coupled together in a circuit configuration, such as a NOR configuration illustrated in FIG. 2. Each memory cell 20 has a drain 22, a source 24, and a stacked gate 26. Each stacked gate 26 is coupled to a wordline ($WL_0$, $WL_1$, ..., $WL_N$) while each drain 22 is coupled to a bitline ($BL_0$, $BL_1$, ... $B_N$). In addition, each source 24 is coupled to ground. Using peripheral decoder and control circuitry (not shown), each memory cell 20 may be addressed for programming, reading, erasing, soft programming, and/or verify functions.

Figure 3:
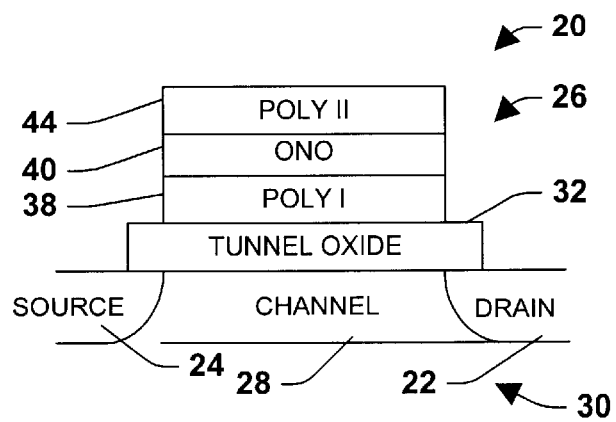
FIG. 3 is a partial cross-sectional view illustrating a conventional stacked gate

FIG. 3 illustrates a cross-sectional view of a single-bit (e.g., stacked gate) memory cell 20, such as may be found in the core regions 12 of FIGS. 1 and 2. Although a single-bit type cell will be described briefly below for purposes of illustration, it should be understood that the present invention is equally applicable to dual bit cells and other flash memory cell architectures, and such alternatives are contemplated as falling within the scope of the present invention. Such a memory cell 20 typically includes the source 24, the drain 22 and a channel 28 in a substrate 30, and the stacked gate structure 26 overlying the channel 28.

The stacked gate 26 includes a thin gate dielectric layer 32 (commonly referred to as the tunnel oxide) formed on the surface of the substrate 30. The tunnel oxide layer 32 coats a portion of the top surface of the silicon substrate 30 and serves to support an array of different layers directly over the channel 28. The stacked gate 26 includes a lower most or first film layer 38, such as doped polycrystalline silicon (polysilicon or poly I) layer which serves as a floating gate 38 that overlies the tunnel oxide 32. Note that the various portions of the transistor 20 highlighted above are not drawn to scale in FIG. 3, but rather are illustrated as such for ease of illustration and to facilitate an understanding of the device operation.

Above the poly I layer 38 is an interpoly dielectric layer 40. The interpoly dielectric layer 40 is often a multilayer insulator such as an oxide-nitride-oxide (ONO) layer having two oxide layers sandwiching a nitride layer, or alternatively can be another dielectric layer such as tantalum pentoxide. Finally, the stacked gate 26 includes an upper or second polysilicon layer (poly II) 44 which serves as a polysilicon control gate overlying the ONO layer 40. The control gates 26 of the respective cells 20 that are formed in a given row share a common wordline (WL) associated with the row of cells (see, e.g., FIG. 2). In addition, as highlighted above, the drain regions 22 of the respective cells in a vertical column are connected together by a conductive bitline (BL). The channel 28 of the cell 20 conducts current between the source 24 and the drain 22 in accordance with an electric field developed in the channel 28 by the stacked gate structure 26.

The memory cell 20 is programmed by applying a relatively high voltage to the control gate 38 and a moderately high voltage to the drain 22 in order to produce "hot" (high energy) electrons in the channel 28 near the drain 22. The hot electrons accelerate across the tunnel oxide 32 and into the floating gate 34, which become trapped in the floating gate 38 because the floating gate 38 is surrounded by insulators (the interpoly dielectric 40 and the tunnel oxide 32). As a result of the trapped electrons, a threshold voltage of the memory cell 20 increases. This change in the threshold voltage (and thereby the channel conductance) of the memory cell 20 created by the trapped electrons is what causes the memory cell 20 to be programmed.

To read the memory cell 20, a predetermined gate voltage greater than the threshold voltage of an unprogrammed memory cell, but less than the threshold voltage of a programmed memory cell, is applied to the control gate 26. If the memory cell 20 conducts (e.g., a sensed current in the cell exceeds a minimum value), then the memory cell 20 has not been programmed (the memory cell 20 is therefore at a first logic state, e.g., a one "1"). Conversely, if the memory cell 20 does not conduct (e.g., the current through the cell does not exceed a threshold value), then the memory cell 20 has been programmed (the memory cell 20 is therefore at a second logic state, e.g., a zero "0"). Thus, each memory cell 20 may be read in order to determine whether it has been programmed (and therefore identify the logic state of the data in the memory cell 20).

In order to erase the memory cell 20, a relatively high voltage is applied to the source 24 and the gate 26 is held at a negative voltage, while the drain 22 is allowed to float. Under these conditions, a strong electric field is developed across the tunnel oxide 32 between the floating gate 38 and the source region 24. The electrons that are trapped in the floating gate 38 flow toward and cluster at the portion of the floating gate 38 overlying the source region 24 and are extracted from the floating gate 38 and into the source region 22 by way of Fowler-Nordheim tunneling through the tunnel oxide 32. Consequently, as the electrons are removed from the floating gate 38, the memory cell 20 is erased.

Figure 4:
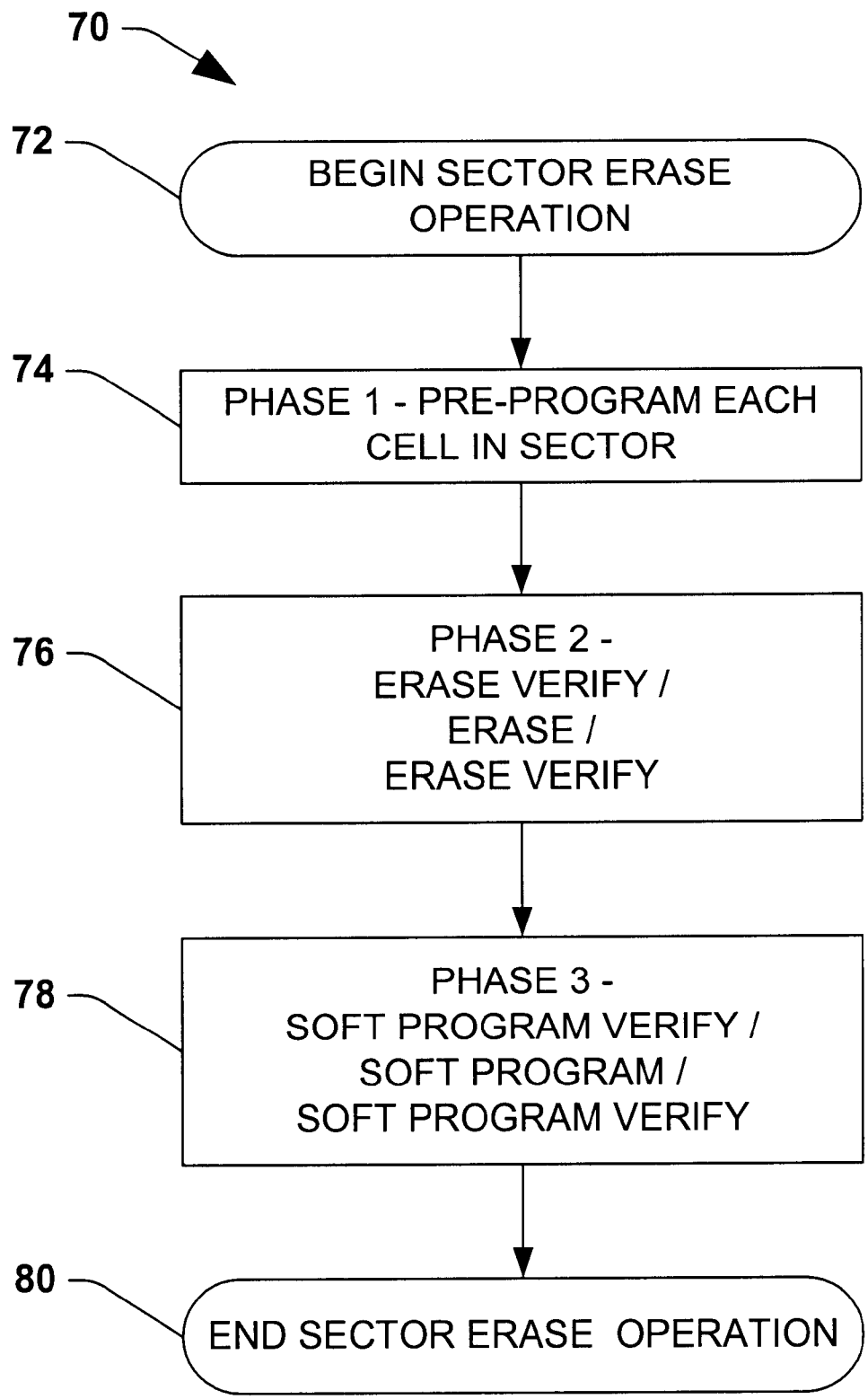
FIG. 4 is a flow diagram illustrating an exemplary four phase sector erase operation in which various aspects of the invention may be carried out.

Referring also to FIG. 4, when a sector of memory cells is erased, an erase verify operation is subsequently performed to ensure proper erasure of each of the cells in a sector. Thereafter, soft programming is employed, wherein a small amount of charge is injected into the cell to rectify or mitigate over-erased conditions resulting from repeated erasure of the cell. The amount of charge injected during the soft programming is controlled so as not to fail erase verify after soft programming and soft program verifying the cells. During a soft program verify operation, moderate positive voltages are applied to the gate and drain while the source is grounded (e.g., tied to VSS) and the resulting current is sensed to verify success of the erase and soft programming. For example, in performing soft programming verification of the stacked gate cell 20 of FIG. 3, the gate 26 may be provided with about 2.7 volts, the drain 22 with 1.2 volts, while the source 24 is grounded.

An exemplary sector or block erase operation 70 is illustrated beginning at step 72, which may be used in association with single-bit and/or dual bit type memory cell architectures. In the first pre-programming phase at step 74, each bit of an array or memory sector is pre-programmed to a known state to effectuate an erasure of each cell in the sector. At step 76, in the second phase, a first erase verify operation is performed to verify proper erasure of each cell in the memory sector, followed by an erase operation, and a second erase verify operation. Thereafter, in the third phase at step 78, a soft-program verify operation is performed, followed by a soft programming operation, and another soft program verify operation in order to ensure against over-erasure of cells within the sector, before the operation 70 ends at 80.

Figure 5:
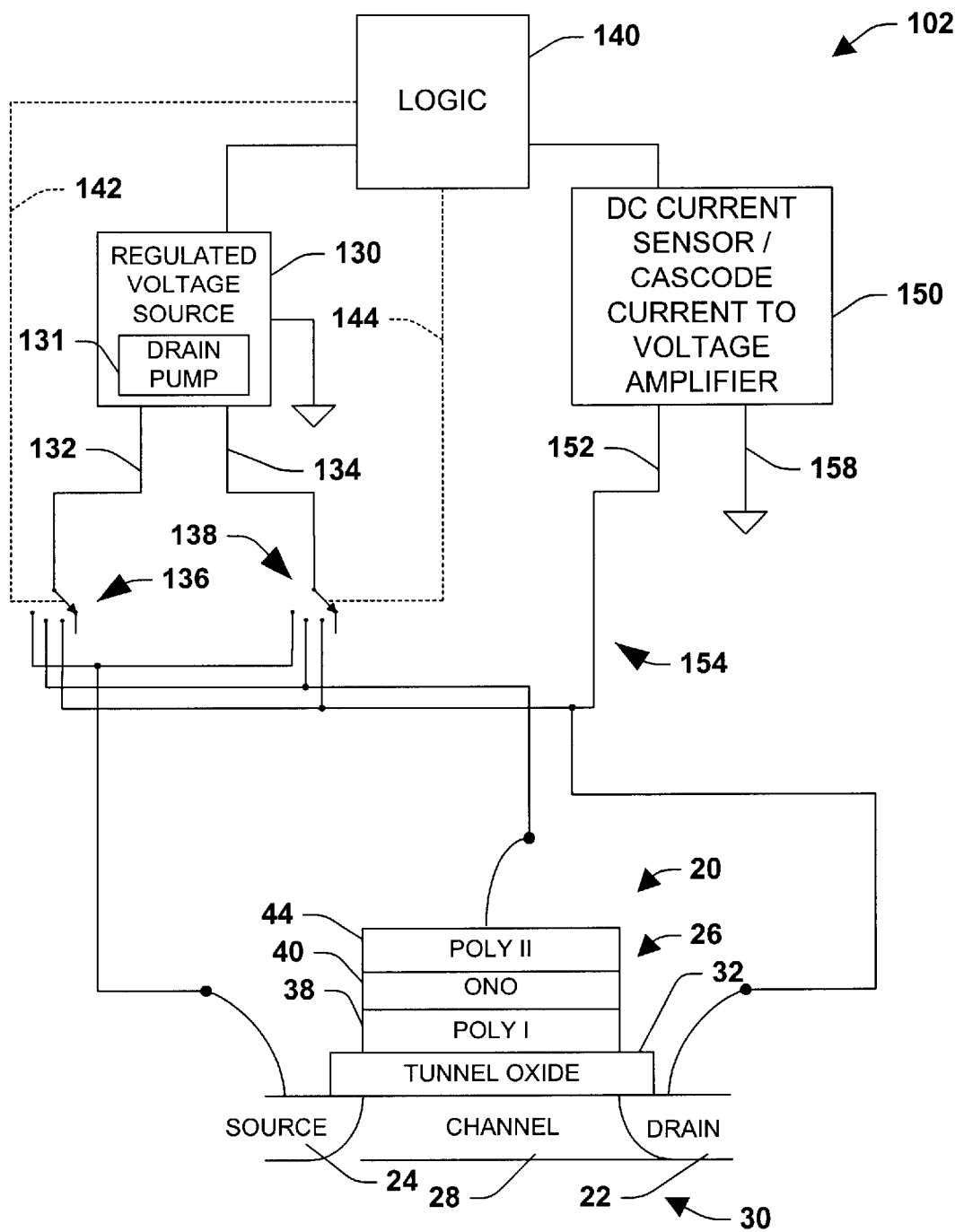
FIG. 5 is a schematic side elevation view in section of an exemplary memory cell and a system for verifying soft programming thereof.

Appropriate voltages must therefore be applied to the various terminals (e.g., source, drain, and gate) of the cells 20 in the memory device 10 in order to perform various operations (e.g., verify, program, erase, read) associated with the device 10. Referring now to FIG. 5, the exemplary memory cell 20 (FIG. 3) is illustrated in section, together with a system 102 for erasing, soft-programming, and/or verifying the cell 20, in accordance with an aspect of the invention. The system 102 includes a regulated voltage source 130 having a first terminal 132 and a second terminal 134, which is adapted to selectively apply a voltage across two of the source 24, the drain 22, and the gate 26 via switching devices 136 and 138 (e.g., decode circuitry) connected to the first and second terminals 132 and 134, respectively. The voltage source 130, moreover, may selectively apply positive or negative voltages to one or both of the terminals 132 and 134, for example, wherein the regulated voltage source 130 comprises a plurality of component voltage sources, such as positive and/or negative charge pumps, or the like, selectively connectable to the terminals 132 and/or 134.

For example, the voltage source 130 comprises a regulated drain pump 131 for connecting to the drain terminal 22 during programming of the cell 20. In the illustrated implementation, the drain pump 131 is a four stage pump circuit operable to provide a regulated voltage of about 4 volts. In order to conserve on the space, complexity, and cost of the memory device, it may be desirable to employ a divided voltage from the drain pump 131 in providing voltage to the gate 26 during soft program verification. As illustrated and described further below with respect to FIG. 7, a regulated voltage VPROG (e.g., about 4 volts) may be provided to the core cell gate via a resistive voltage divider network, whereby the gate voltage is about 2.7 volts during a soft program verify operation. However, the drain pump 131 is adapted to provide not only voltage, but up to about 3 mA of current for such use in connection with the drain 22 during channel hot electron (CHE) programming operations. Because of this current capability, connecting the drain pump 131 to the higher impedance gate terminal 26 during the soft program verify operation may result in an overshoot of the voltage at the gate 26, and consequently, the possibility of anomalous soft program verify results.

The switching devices 136 and 138 are controlled by a logic device 140 via control lines 142 and 144, respectively, wherein the switching devices 136 and 138 may be semiconductor transistors, gates, or other types of switching devices. The system 102 further comprises a DC current sensor/cascode current to voltage amplifier 150 having a first terminal 152 connected to the drain 22 during soft program verify operations. The current sensor 150 further includes a second terminal 158 connected to a common or ground. The current sensor 150 may also include a sense amplifier circuit (not shown) which is "on-chip" with respect to the cells under test.

The logic device or circuit 140 is thus adapted to selectively provide for the application of voltages (e.g., positive, negative, or ground) to the various terminals (e.g., gate 26, drain 22, source 24) of the memory cell 20 via the source 130 and the switching devices 136 and 138, and to selectively measure or sense a current associated with the cell 20 using the sensor 150 and the switching device 154, in order to selectively program, soft program, erase, read, and/or verify soft programming or erasure of the cell 20. The logic circuit 140 resides "on-chip" with respect to the memory cells under test. The cell 20, moreover, may be connected with other such cells (not shown) in a NOR type configuration (e.g., with the respective gates 26 thereof connected together by a common word line associated with a row of such cells). The system 102 may accordingly further include circuitry for individually applying voltages and/or measuring currents associated with such other cells (not shown).

Figure 6:
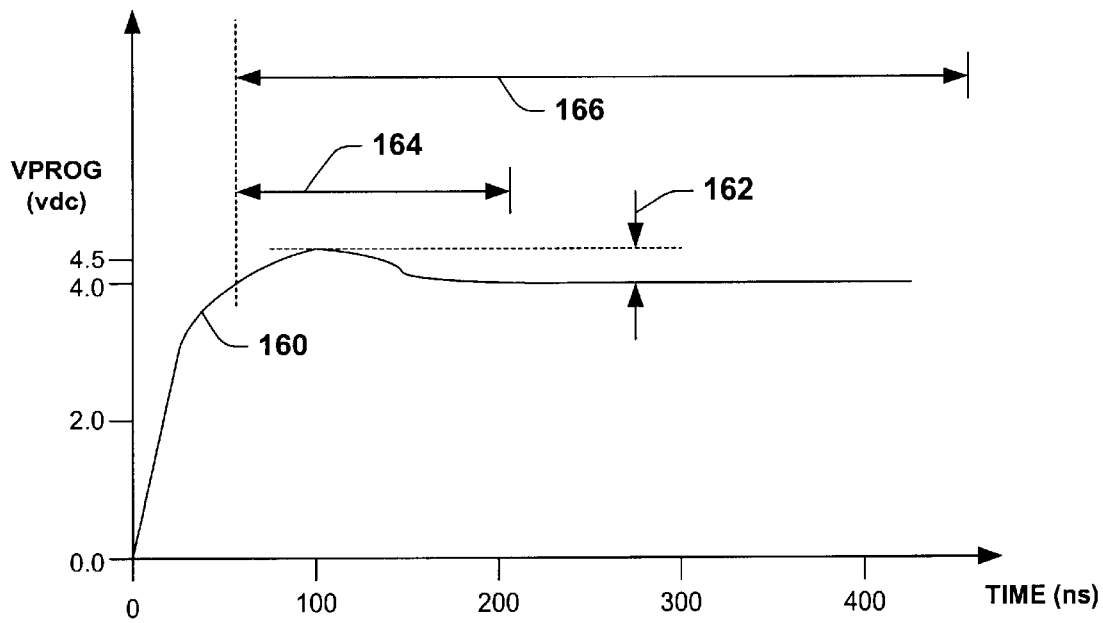
FIG. 6 is a graph illustrating voltage overshoot in applying a gate voltage to the cell of FIG. 5 using a drain pump.
Figure 7:
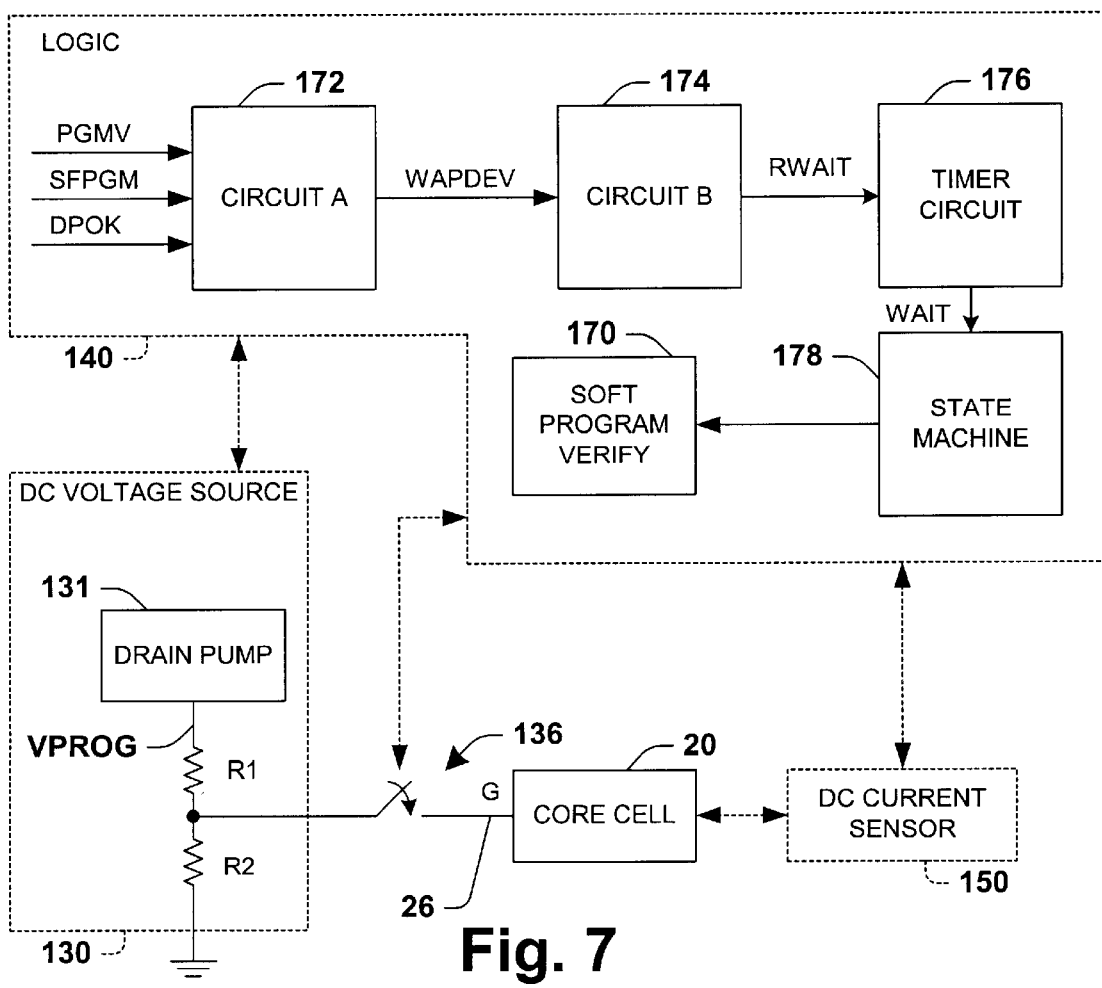
FIG. 7 is a schematic diagram illustrating one exemplary implementation of a system for verifying soft programming in a memory core cell in accordance with the invention.

Referring now to FIGS. 6 and 7, the drain pump 131 provides a regulated voltage VPROG (e.g., about 4 volts dc) to, for example, a voltage divider network comprising resistors R1 and R2 during soft program verify (e.g., at 78 of FIG. 4). A divided voltage of about 2.7 volts is then provided to the gate 26 of the core cell 20 using the switching device 136. However, as illustrated in FIG. 6, the connection of the drain pump 131 with the gate terminal 26 (e.g., by closure of the switch 136) results in an overshoot 162 of the voltage VPROG 160 after the drain pump 131 begins charging up, for example, where the overshoot 162 can be as much as about 0.5 to 0.7 volts above the regulation value of 4.0 volts. The overshoot 162, moreover, may persist for a time 164 before the regulation of the drain pump 131 brings VPROG 160 back to the 4 volt regulation level or within an acceptable tolerance band around 4 volts. Where the overshoot 162 may cause adverse results during soft program verify operation, the present invention provides for waiting a fixed time period 166 after the voltage 160 initially exceeds the regulation level before initiating the soft program verify.

The invention can thus be employed to connect the drain pump 131 to the core cell gate 26 through the resistor divider (e.g., R1 and R2) and switch 136, to determine when the voltage VPROG 160 reaches 4 volts, and then to provide a soft program verify signal 170 to the sensor 150 when or after the time period 166 expires. In this manner, the invention ensures that the high and/or unstable voltages during the initial period 164 have settled or subsided to an acceptable level, after which proper soft program verify can be achieved. This allows the drain pump 131 to be used for supplying the gate voltage during soft program verify, in addition to supplying the drain during programming operation.

Referring now to FIG. 7, one or more aspects of the invention are implemented in the logic circuit 140. The logic circuit 140 provides a regulated voltage source (e.g., drain pump 131) to the gate 26 during a soft program verify operation, for instance, using switch 136 and resistors R1 and R2. The sensor 150 is connected to the cell 20 to verify soft programming when a first voltage (e.g., about 2.7 volts) is applied to the gate 26 from the regulated voltage source 131. The circuit 140 provides a soft program verify signal 170 from a state machine 178 to the sensor 150 to verify soft programming after overshoot 162 has settled. In the illustrated implementation, the soft program verify signal 170 is provided to the sensor 150 a fixed time period 166 after the drain pump 131 has a value greater than the regulation point (e.g., about 4 volts).

The logic circuit 140 comprises a first circuit 172 inputting signals PGMV, SFPGM, and DPOK, in order to determine that the current operation is a soft program verify, and that the drain pump has successfully reached or exceeded the 4 volt regulation value. For example, the SFPGM signal may be active during soft program and soft program verify modes and PGMV may be active during verify modes. In addition, the DPOK signal is active when the regulated voltage VPROG 160 has reached the regulation point of about 4 volts. If so, the circuit 140 provides a first signal WAPDEV to a second circuit 174, which in turn generates a first wait signal RWAIT indicative of the fixed time period 166.

The RWAIT signal is provided to a timer circuit 176, which may be, for example, a general purpose timer used for various timer tasks in the memory device. The timer circuit 176 receives the RWAIT signal and provides a second wait signal WAIT to the state machine 178 the fixed time period 166 after the first signal WAPDEV. For example, the fixed time period 166 can be about 200 ns or more and about 500 ns or less. In one implementation, the time period 166 is about 350 ns or more and about 450 ns or less, where a period of about 400 ns has been found to ensure that the unstable or high voltage period 164 has passed. In this regard, any appropriate time period can be established by which the unstable or overshoot period 164 can be avoided during soft program verify operation. For instance, the fixed time period for a given regulated voltage source may be determined according to the response time characteristics of the associated regulator.

The state machine 178, which may be used in the logic circuit 140 for various tasks associated with read, program, erase, soft program, and verification operations, accordingly provides the soft program verify signal 170 to the sensor 150 according to the WAIT signal. In the illustrated implementation, the state machine 178 waits until receipt of the WAIT signal from the timer circuit 176 before transitioning from a VERIFY1 state to a VERIFY2 state (not shown), where the VERIFY 2 state causes the soft program verify to occur via signal 170 and sensor 150. In this manner, the soft program verify does not take place until a fixed time period 166 has completed (e.g., following the DPOK signal indicating VPROG has reached 4 volts), thereby ensuring against a high or unstable gate voltage on the cell gate 26.

Figure 8:
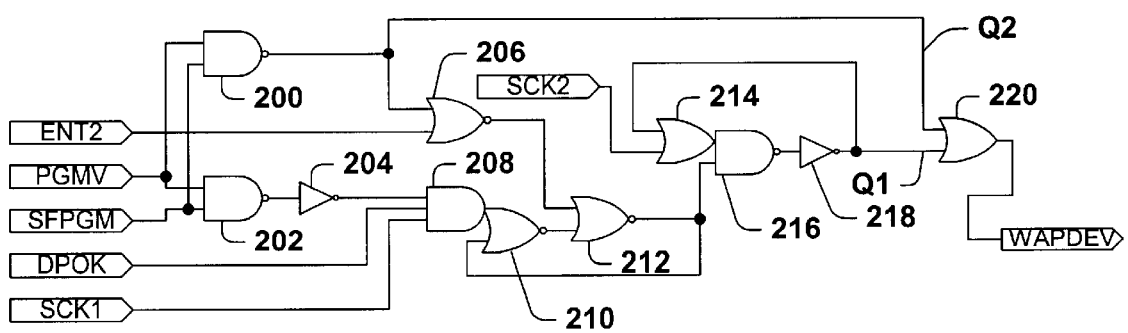
FIG. 8 is a schematic diagram illustrating further details of the circuit of FIG. 7.
Figure 9:
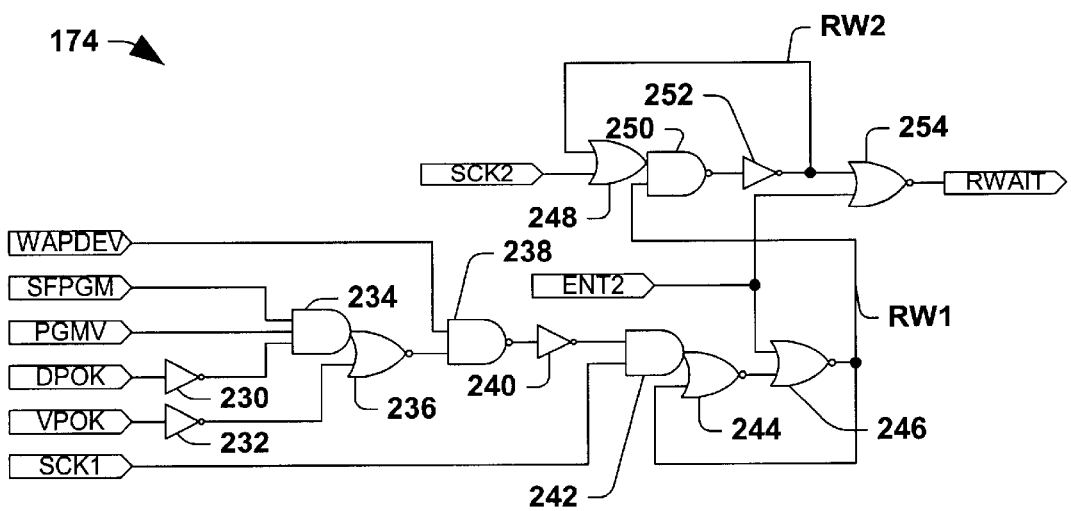
FIG. 9 is a schematic diagram illustrating further details of the circuit of FIGS. 7 and 8.
Figure 10:
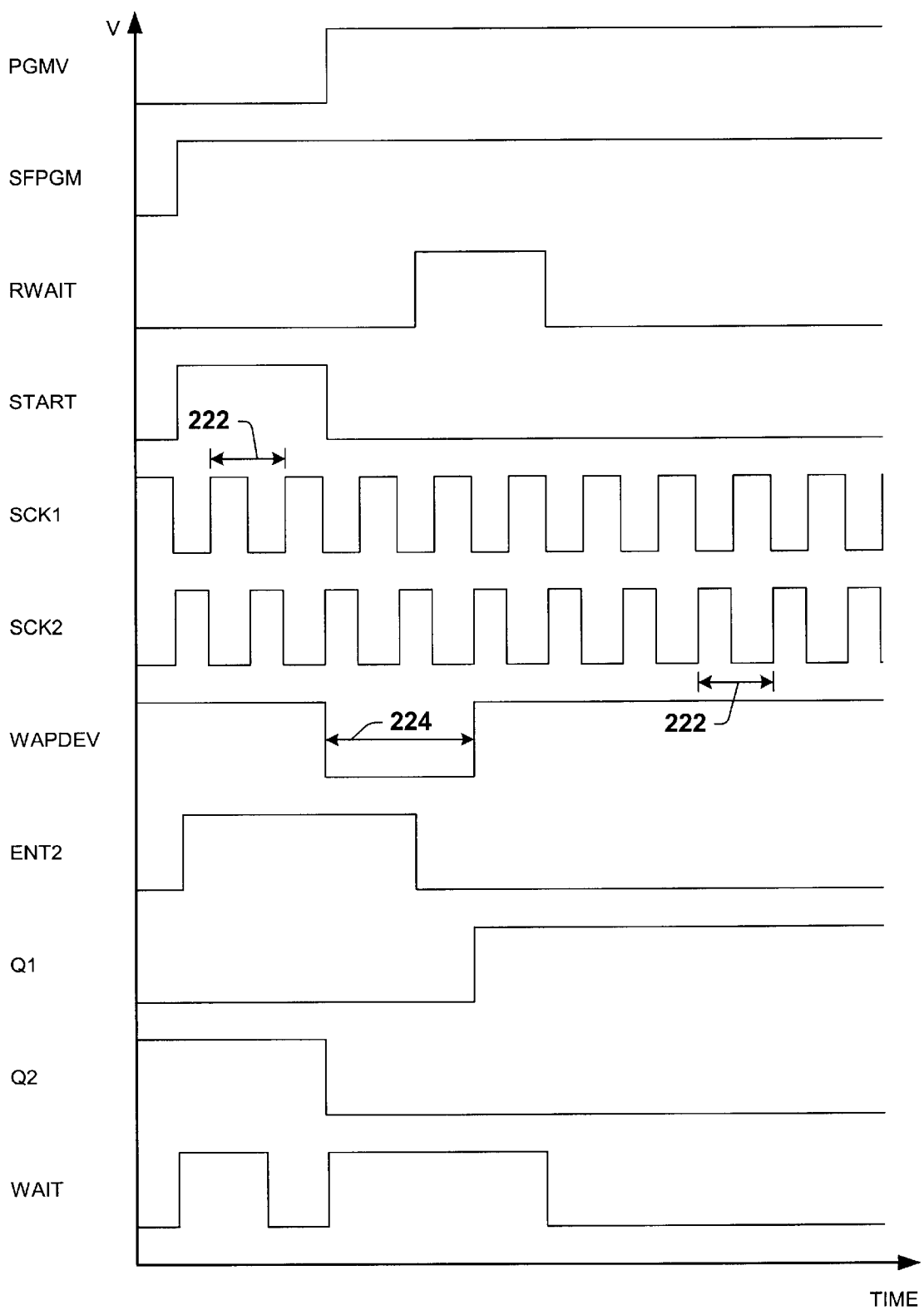
FIG. 10 is a timing diagram illustrating signals associated with the circuit of FIGS. 7–9.

Referring now to FIGS. 8–10, exemplary implementations of the first and second circuits 172 and 174, respectively, are illustrated, together with an exemplary timing diagram showing the relationship of several associated signals. It will be appreciated that the invention is not limited to the illustrated implementations for the circuits 172 and 174, and that any appropriate apparatus can be used, which determines that the current mode is soft program verify and that the drain pump 131 is at or above the regulation point. Signal Q2 in circuit 172 is low when both PGMV and SFPGM are high via NAND gate 200, indicating soft program verify mode. A signal Q1 goes high two cycles of clock signal SCK2 after Q2 goes low via gates 202, 204, 206, 208, 210, 212, 214, 216, and 218, wherein the clock cycles 222 of SCK2 (e.g., and SCK1) are about 200 ns in duration (see, for example, FIG. 10).

The WAPDEV signal is low when both signals Q1 and Q2 are low via OR gate 220, whereby the time period 224 when the WAPDEV signal is low is about 400 ns. Any appropriate time period 224 can be used in accordance with the invention, by which the fixed period is long enough to ensure the overshoot 162 has subsided in the VPROG voltage 160 (FIG. 6). The second circuit 174 receives the WAPDEV signal from the first circuit 172 along with the SFPGM, PGMV, and DPOK signals, and generates the RWAIT signal via gates 230, 232, 234, 236, 238, 240, 242, 244, 246, 248, 250, 252, and 254, wherein RWAIT is low when either or both of signals RW1 and RW2 are high. The RWAIT signal is then provided to the timer circuit 176 (FIG. 7) which generates the WAIT signal in accordance therewith. Rather than allowing the state machine 178 to provide the soft program verify signal 170 immediately after the DPOK signal (indicating the drain pump 131 has reached the regulation level), the invention thus provides a fixed time period 166 during which the overshoot 162 in VPROG 160 (e.g., and hence any overshoot or other instability at the gate 26 of cell 20) subsides through the regulation (not shown) of the drain pump 131. Once the fixed time period is over, the soft program verify signal 170 is generated by the state machine 178 to perform the soft program verification (e.g., 80 of FIG. 4).

Another aspect of the invention provides methodologies for verifying soft programming in memory devices, which may be carried out in the apparatus and systems illustrated and described above, as well as in any memory device. The invention contemplates providing a regulated voltage source to a memory cell gate through a voltage divider during a soft program verify operation, and verifying soft programming of the cell using a sensor after overshoot in the regulated voltage source has settled. The verification can comprise waiting a fixed time period, such as about 400 ns, after the regulated voltage source is greater than a regulation level, and sensing a current associated with the cell after the fixed time period using a sensor. Waiting for a fixed time period can comprise creating a first signal when the regulated voltage source has a value greater than the regulation value, generating a first wait signal indicative of the fixed time period according to the first signal, providing a second wait signal the fixed time period after the first signal, and thereafter providing a soft program verify signal to the sensor according to the second wait signal.

Figure 11:
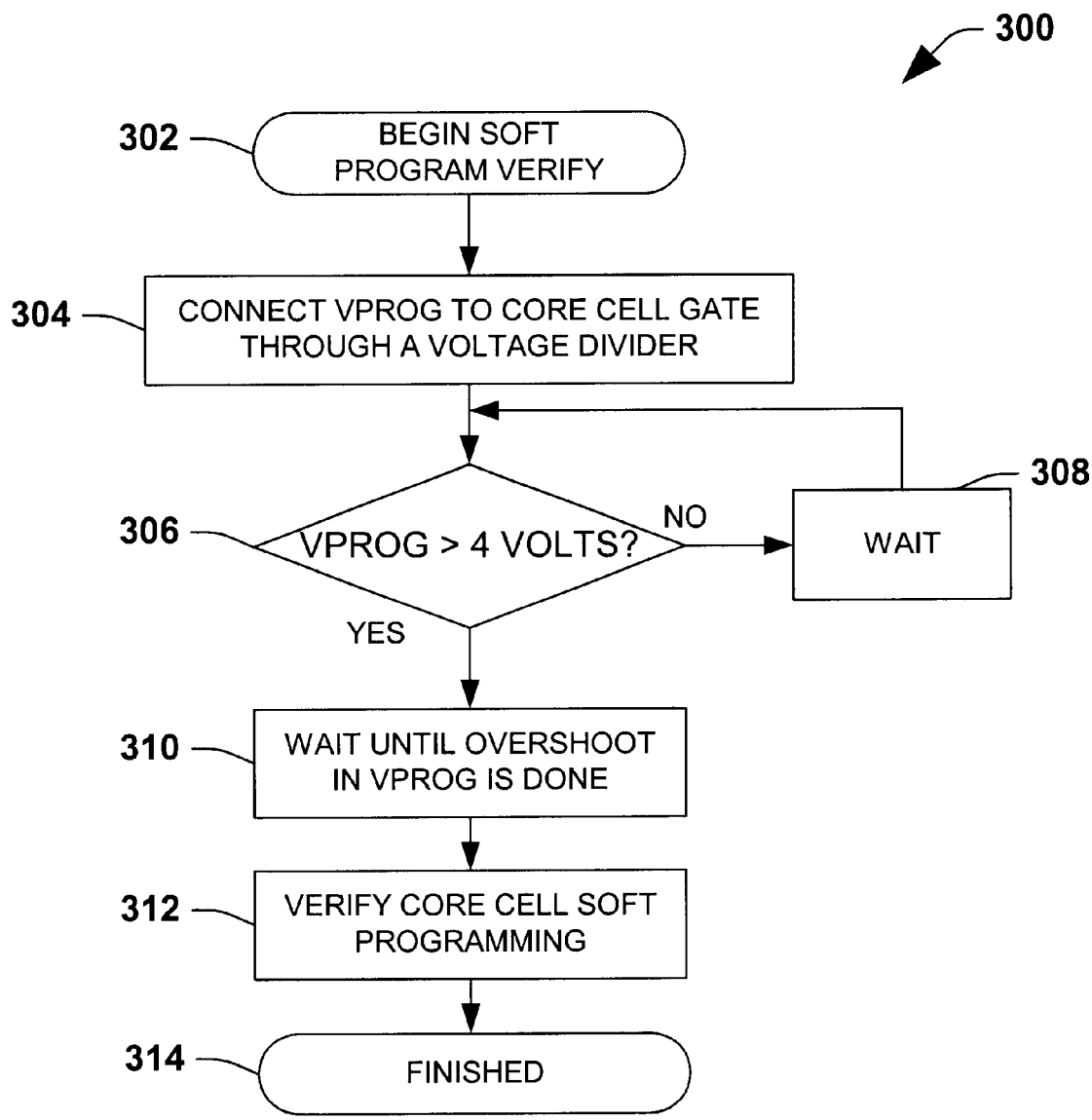
FIG. 11 is a flow diagram illustrating an exemplary method of verifying soft programming in a memory device according to another aspect of the invention.

One such method 300 is illustrated in FIG. 11 in accordance with the invention. While the exemplary method 300 is illustrated and described herein as a series of acts or events, it will be appreciated that the present invention is not limited by the illustrated to ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. Moreover, it will be appreciated that the method 300 may be implemented in association with the apparatus and systems illustrated and described herein as well as in association with other systems not illustrated. For example, the method 300 and other methods within the scope of the invention can be implemented in the logic circuit 140 of FIGS. 5 and 7.

Beginning at 302, a soft program verify operation is initiated, wherein a regulated source voltage VPROG is connected to a core memory cell gate through a voltage divider at 304. For example, the voltage VPROG 160 of drain pump 131 can be connected to the gate 26 of cell 20 as illustrated in FIG. 7, using resistors R1 and R2 as well as the switching device 136. At 306, a determination is made as to whether VPROG has risen to a predetermined level, such as about 4 volts (e.g., as indicated by signal DPOK above). If not, the method 300 waits at 308 until VPROG is found to be above 4 volts at 306. Thereafter, the method 300 waits at 310 until any overshoot or instability in the VPROG voltage has subsided. For instance, the method 300 may wait for a fixed time period (e.g., about 400 ns) at 310, in order to ensure that the overshoot 162 in VPROG (FIG. 6) has settled out. The soft programming of the cell is then verified at 312, whereafter the method 300 ends at 314. It will be noted that without the wait period at 310, the soft program verification at 312 may be subject to errors, due to inappropriate (e.g., high or unstable) voltage levels at the gate of the core cell being verified. Thus, the methodology 300 mitigates or avoids anomalous soft program verify results associated with overshoot and/or instability in gate voltage levels.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description and the claims, such terms are intended to be inclusive in a manner similar to the term "comprising."

What is claimed is:

1. A memory device, comprising:
    at least one core cell having a gate, a drain, and a source, the at least one core cell being operative to store at least one bit of information;
    a logic circuit operative to provide a regulated voltage source to the gate during a soft program verify operation; and
    a sensor associated with the at least one core cell during the soft program verify operation and operable to verify soft programming of the at least one core cell according to a soft program verify signal;
    wherein the logic circuit provides the soft program verify signal to the sensor to initiate soft programming verification of the at least one core cell after an overshoot in the regulated voltage source is substantially completed.

2. The memory device of claim 1, wherein the logic circuit applies a first voltage to the gate from the regulated voltage source, and wherein the logic circuit provides the soft program verify signal to the sensor a fixed time period after the regulated voltage source has a value greater than a second voltage.

3. The memory device of claim 2, wherein the logic circuit comprises:
    a first circuit creating a first signal when the regulated voltage source has a value greater than the second voltage;
    a second circuit receiving the first signal and generating a first wait signal indicative of the fixed time period according to the first signal;
    a timer circuit receiving the first wait signal and providing a second wait signal the fixed time period after the first signal; and
    a state machine providing the soft program verify signal to the sensor according to the second wait signal.

4. The memory device of claim 3, wherein the second voltage is about 4 volts or more, the first voltage is about 2.7 volts and the fixed time period is about 200 ns or more and about 500 ns or less.

5. The memory device of claim 4, wherein the fixed time period is about 350 ns or more and about 450 ns or less.

6. The memory device of claim 3, wherein the regulated voltage source comprises a drain pump selectively connected to the drain of the at least one core cell during a programming operation.

7. The memory device of claim 2, wherein the fixed time period is about 350 ns or more and about 450 ns or less.

8. The memory device of claim 1, wherein the regulated voltage source comprises a drain pump selectively connected to the drain of the at least one core cell during a programming operation.

9. The memory device of claim 2, wherein the first voltage is about 2.7 volts.

10. The memory device of claim 9, wherein the logic circuit provides the soft program verify signal to the sensor a fixed time period after the regulated voltage source has a value greater than a second voltage.

11. The memory device of claim 10, wherein the fixed time period is about 350 ns or more and about 450 ns or less.

12. A memory device, comprising:
    at least one core cell having a gate, a drain, and a source;
    means for providing a regulated voltage source to the gate through a voltage divider during a soft program verify operation; and
    means for verifying soft programming of the at least one core cell after overshoot in the regulated voltage source has settled.

13. The memory device of claim 12, wherein the means for verifying soft programming comprises a sensor in electrical communication with the at least one core cell during the soft program verify operation to verify soft programming of the at least one core cell based on a soft program verify signal, and a logic circuit providing a soft program verify signal to the sensor to verify soft programming of the at least one core cell after overshoot in the regulated voltage source has settled.

14. A memory device, comprising:

at least one core cell having a gate, a drain, and a source;

means for providing a regulated voltage source to the gate during a soft program verify operation; and means for verifying soft programming of the at least one core cell after overshoot in the regulated voltage source has settled;

wherein the means for verifying soft programming comprises a sensor in electrical communication with the at least one core cell during the soft program verify operation to verify soft programming of the at least one core cell based on a soft program verify signal, and a logic circuit providing a soft program verify signal to the sensor to verify soft programming of the at least one core cell after overshoot in the regulated voltage source has settled; and wherein the logic circuit provides the soft program verify signal to the sensor a fixed time period after the regulated voltage source has a value greater than a regulation level.

15. The memory device of claim 14, wherein the logic circuit comprises:

a first circuit creating a first signal when the regulated voltage source has a value greater than the regulation level;

a second circuit receiving the first signal and generating a first wait signal indicative of the fixed time period according to the first signal;

a timer circuit receiving the first wait signal and providing a second wait signal the fixed time period after the first signal; and a state machine providing the soft program verify signal to the sensor according to the second wait signal.

16. The memory device of claim 14, wherein the regulation level is about 4 volts or more, and wherein the fixed time period is about 200 ns or more and about 500 ns or less.

17. A method of verifying soft programming in a memory device having at least one core cell with a gate, a drain, and a source, the method comprising:

providing a regulated voltage source to the gate through a voltage divider during a soft program verify operation; and verifying soft programming of the at least one core cell using a sensor after an overshoot in the regulated voltage source has subsided.

18. The method of claim 17, wherein providing a regulated voltage source comprises providing a first voltage to the gate, and wherein verifying soft programming comprises:

waiting a fixed time period after the regulated voltage source is greater than a regulation level; and sensing a current associated with the at least one core cell after the fixed time period using a sensor.

19. The method of claim 18, wherein waiting a fixed time period comprises:

creating a first signal when the regulated voltage source has a value greater than the regulation level;

generating a first wait signal indicative of the fixed time period according to the first signal;

providing a second wait signal the fixed time period after the first signal; and providing a soft program verify signal to the sensor according to the second wait signal.

20. The method of claim 18, wherein waiting a fixed time period comprises waiting about 350 ns or more and about 450 ns or less after the regulated voltage source is greater than the regulation level.

21. A soft programming verification system in a memory device having at least one core cell with a gate, a drain, and a source, the at least one memory cell, the soft programming verification system comprising:

a drain pump adapted to selectively provide a regulated voltage to the drain during a programming operation;

a sensor associated with the at least one memory cell and operable to verify soft programming of the at least one memory cell according to a soft program verify signal; and a logic circuit operatively associated with the drain pump to selectively provide the regulated voltage from the drain pump to the gate through a voltage divider during a soft programming verification operation, and to provide the soft program verify signal to the sensor to initiate soft programming verification of the at least one memory cell after an overshoot in the regulated voltage is substantially completed.

22. The system of claim 21, wherein the logic circuit applies a first voltage to the gate from the drain pump, and wherein the logic circuit provides the soft program verify signal to the sensor a fixed time period after the regulated voltage reaches a value greater than or equal to a second voltage.

23. The system of claim 22, wherein the logic circuit comprises:

a first circuit creating a first signal when the regulated voltage has a value greater than or equal to the second voltage;

a second circuit receiving the first signal and generating a first wait signal indicative of the fixed time period according to the first signal;

a timer circuit receiving the first wait signal and providing a second wait signal the fixed time period after the first signal; and a state machine providing the soft program verify signal to the sensor according to the second wait signal.

24. The system of claim 23, wherein the second voltage is about 4 volts or more, the first voltage is about 2.7 volts, and the fixed time period is about 200 ns or more and about 500 ns or less.

25. The system of claim 21, wherein the fixed time period is about 350 ns or more and about 450 ns or less.

* * * * *

UNITED STATES PATENT AND TRADEMARK OFFICE
CERTIFICATE OF CORRECTION

PATENT NO. : 6,532,175 B1
DATED : March 11, 2003
INVENTOR(S) : Santosh K. Yachareni, Edward V. Bautista, Jr. and Weng Fook Lee It is certified that error appears in the above-identified patent and that said Letters Patent is hereby corrected as shown below:

Column 4,
Line 61, after the phrase "conventional stacked gate", please insert the phrase
-- memory cell with which aspecs of the present invention can be
implemented; --.

Signed and Sealed this

Fifteenth Day of July, 2003

JAMES E. ROGAN
*Director of the United States Patent and Trademark Office*